United States Patent
Coppa et al.

(10) Patent No.: US 12,368,433 B2
(45) Date of Patent: Jul. 22, 2025

(54) ELECTRONIC SYSTEM, INTEGRATED CIRCUIT, AND METHOD FOR GENERATING SEQUENTIAL SIGNALS

(71) Applicant: STMicroelectronics S.r.l., Agrate Brianza (IT)

(72) Inventors: Pietro Antonino Coppa, Gravina di Catania (IT); Gianbattista Lo Giudice, Pedara (IT); Enrico Castaldo, Catania (IT); Antonino Conte, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 60 days.

(21) Appl. No.: 18/451,272

(22) Filed: Aug. 17, 2023

(65) Prior Publication Data

US 2024/0088875 A1    Mar. 14, 2024

(30) Foreign Application Priority Data

Sep. 14, 2022   (IT) .................. 102022000018774

(51) Int. Cl.
*H03K 3/03* (2006.01)
*H03K 3/011* (2006.01)
(Continued)

(52) U.S. Cl.
CPC .......... *H03K 3/0315* (2013.01); *H03K 3/011* (2013.01); *H03K 3/013* (2013.01); *H03K 3/354* (2013.01); *H03L 5/00* (2013.01); *H03L 7/0995* (2013.01)

(58) Field of Classification Search
CPC ...... H03K 3/0315; H03K 3/011; H03K 3/354; H03K 3/013; H03L 7/0995; H03L 5/00
(Continued)

(56) References Cited

U.S. PATENT DOCUMENTS 5,331,295 A    7/1994   Jelinek et al.
5,412,349 A *  5/1995   Young .................. H03L 7/0995
                                                          331/34

(Continued)

FOREIGN PATENT DOCUMENTS

EP         2482453 A1    8/2012

OTHER PUBLICATIONS

Alon, Elad, et al., "Replica Compensated Linear Regulators for Supply-Regulated Phase-Locked Loops," IEEE Journal of Solid-State Circuits, vol. 41, No. 2, Feb. 2006, pp. 413-424.

*Primary Examiner* — Arnold M Kinkead
(74) *Attorney, Agent, or Firm* — Slater Matsil, LLP

(57) ABSTRACT

An electronic system is configured to generate a sequential logic signal. The electronic system includes a first ring oscillator including a first plurality of cascaded inverter stages. A combinational logic circuit is configured to generate the sequential logic signal by combining signals at the output terminals of at least two of the inverter stages of the first ring oscillator. The electronic system further includes a second ring oscillator including a second plurality of cascaded inverter stages. A bias current source is configured to supply the inverter stages of the second ring oscillator with a bias current, and a first voltage is generated at the inverter stages of the second ring oscillator. A voltage follower is configured to supply the inverter stages of the first ring oscillator with a second voltage corresponding to the first voltage generated at the inverter stages of the second ring oscillator.

20 Claims, 8 Drawing Sheets

(51) Int. Cl.
  *H03K 3/013* (2006.01)
  *H03K 3/354* (2006.01)
  *H03L 5/00* (2006.01)
  *H03L 7/099* (2006.01)

(58) Field of Classification Search
  USPC .............................. 331/2, 46, 57, 185, 183
  See application file for complete search history.

(56) References Cited

U.S. PATENT DOCUMENTS

| | | |
|---|---|---|
| 2002/0039051 A1* | 4/2002 | Ito ..................... H03L 7/0995 |
| | | 331/25 |
| 2009/0302954 A1 | 12/2009 | Chen et al. |
| 2012/0256693 A1 | 10/2012 | Raghunathan et al. |
| 2013/0120072 A1 | 5/2013 | Murphy et al. |
| 2019/0222203 A1 | 7/2019 | Tripoli et al. |
| 2019/0372579 A1 | 12/2019 | La Rosa et al. |

* cited by examiner

ELECTRONIC SYSTEM, INTEGRATED CIRCUIT, AND METHOD FOR GENERATING SEQUENTIAL SIGNALS

CROSS-REFERENCE TO RELATED APPLICATIONS

This application claims priority to Italian Application No. 102022000018774, filed on Sep. 14, 2022, which application is hereby incorporated herein by reference.

TECHNICAL FIELD

The present disclosure generally relates to systems and circuits configured to generate sequential signals.

BACKGROUND

FIG. 1 shows a typical electronic system, e.g., integrated in an integrated circuit.

Specifically, in the example considered, a sequential logic circuit 3 is configured to generate a plurality of digital signals SEQ, such as k binary signals $SEQ_1$-$SEQ_k$. For example, the sequential logic signals SEQ may be used by a digital and/or analog circuit 4. For example, the circuit 4 may be a memory, such as a non-volatile memory (NVM), such as a flash memory, and the signals SEQ may correspond to the signals used to start the memory 4 and perform a read operation. Typically, the sequential logic circuit 3 generates the sequential logic signals SEQ in response to an oscillating signal OSC, which is generated by an oscillator 2. For example, typically, the oscillator 2 is supplied via a power supply circuit 1.

SUMMARY

In various embodiments, the present disclosure provides improved solutions for generating sequential logic signals.

According to one or more embodiments, improved solutions for generating sequential logic signals are provided by an electronic system as described herein. Embodiments moreover concern related integrated circuits and methods.

As mentioned before, various embodiments of the present disclosure relate to an electronic system configured to generate at least one sequential logic signal. In various embodiments, the electronic system comprises a ring oscillator comprising a cascade of inverter stages, including a first inverter stage, a last inverter stage, and one or more intermediate inverter stages. In various embodiments, a combinational logic circuit is configured to generate the sequential logic signal by combining at least two of the signals at the output terminals of the inverter stages of the ring oscillator.

In some embodiments, as will be described in greater detail in the following, the ring oscillator is supplied via a voltage. In some embodiments, the electronic system comprises a further ring oscillator comprising a further cascade of inverter stages, including a first inverter stage, a last inverter stage, and one or more intermediate inverter stages. In some embodiments, the number of inverter stages of the further ring oscillator corresponds to the number of inverter stages of the ring oscillator.

In some embodiments, this further ring oscillator is supplied via a bias current, i.e., the electronic system comprises a bias current source configured to supply the inverter stages of the further ring oscillator with a bias current.

Accordingly, in this way, a voltage is generated at the inverter stages of the further ring oscillator. In various embodiments, this voltage is used to supply the inverter stages of the ring oscillator. For example, in various embodiments, the electronic system comprises a voltage follower configured to supply the inverter stages of the ring oscillator with a voltage corresponding to the voltage generated at the inverter stages of the further ring oscillator.

In some embodiments, the bias current may be used to set the delay introduced by the inverter stages of the further ring oscillator, and by applying the voltage generated at the inverter stages of the further ring oscillator to the inverter stages of the ring oscillator, the inverter stages of the ring oscillator will introduce the same or at least a proportional delay. As will be described in greater detail in the following, this is in particular useful when the inverter stages of the ring oscillator are used as delay stages for generating the sequential logic signal by propagating rising and/or falling edges through the inverter stages of the ring oscillator.

For example, in various embodiments, the ring oscillator comprises a start circuit configured to receive a calibration mode signal and a start signal. In response to determining that the calibration mode signal indicates a calibration mode, the start circuit connects the output terminal of the last inverter stage of the ring oscillator to the input terminal of the first inverter stage of the ring oscillator, whereby the ring oscillator oscillates. Conversely, in response to determining that the calibration mode signal indicates a normal operating mode, the start circuit selectively changes, in response to the start signal, the logic level applied to the input terminal of the first inverter stages of the ring oscillator, whereby a rising or falling edge is propagated through the cascade of inverter stages of the ring oscillator in response to the start signal.

In various embodiments, the current source may thus be configured to generate a variable current as a function of a calibration signal. In this case, the electronic system may comprise a storage element configured to store a value indicative of the calibration signal and a control circuit configured to generate the calibration signal as a function of the value stored by the storage element. For example, in various embodiments, the electronic system comprises a communication interface, and the control circuit is configured to receive during the calibration mode data via the communication interface, and store the data to the storage element, thereby updating the calibration signal.

Accordingly, in various embodiments a calibration circuit may be configured to set the calibration mode signal in order to activate the calibration mode, measure the frequency of the signal provided by one of the inverter stages of the ring oscillator, and program the storage element in order to set the frequency to a requested value.

In at least one embodiment, an electronic system is provided that includes a first ring oscillator. The first ring oscillator includes a first plurality of cascaded inverter stages including a first inverter stage, a last inverter stage, and one or more intermediate inverter stages. Each of the inverter stages of the first plurality of cascaded inverter stages includes an input terminal and an output terminal. A combinational logic circuit is configured to generate a sequential logic signal by combining signals at the output terminals of at least two of the inverter stages of the first ring oscillator. A second ring oscillator includes a second plurality of cascaded inverter stages including a first inverter stage, a last inverter stage, and one or more intermediate inverter stages. A bias current source is configured to supply the second plurality of cascaded inverter stages of the second ring oscillator with a bias current. A first voltage is generated at the second plurality of cascaded inverter stages of the second ring oscillator. A voltage follower is configured to supply the first plurality of cascaded inverter stages of the first ring oscillator with a second voltage corresponding to the first voltage generated at the second plurality of cascaded inverter stages of the second ring oscillator.

In at least one embodiment, an integrated circuit is provided that includes an electronic system. The electronic system includes a first ring oscillator and a second ring oscillator. Each of the first and second ring oscillators includes a first inverter stage, a last inverter stage, and at least one intermediate inverter stage coupled between the first inverter stage and the last inverter stage. Each of the inverter stages includes an input terminal and an output terminal. A combinational logic circuit is configured to generate a sequential logic signal based on output signals at the output terminals of at least two of the inverter stages of the first ring oscillator. A bias current source is configured to supply a bias current to the inverter stages of the second ring oscillator. A first voltage is generated at the inverter stages of the second ring oscillator. A voltage follower is configured to supply a second voltage to the inverter stages of the first ring oscillator, and the second voltage has a voltage level corresponding to a voltage level of the first voltage.

In at least one embodiment, a method of operating an electronic system is provided. The electronic system includes a first ring oscillator and a second ring oscillator. Each of the first and second ring oscillators includes a first inverter stage, a last inverter stage, and at least one intermediate inverter stage coupled between the first inverter stage and the last inverter stage. Each of the inverter stages includes an input terminal and an output terminal. The method includes: generating a first voltage at the inverter stages of the second ring oscillator by supplying, by a bias current source, a bias current to the second ring oscillator; and generating, by a voltage follower, a second voltage corresponding to the first voltage, and applying the second voltage to the inverter stages of the first ring oscillator.

BRIEF DESCRIPTION OF THE DRAWINGS

For a more complete understanding of one or more embodiments of the present disclosure, and the advantages thereof, reference is now made to the following descriptions taken in conjunction with the accompanying drawings, in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
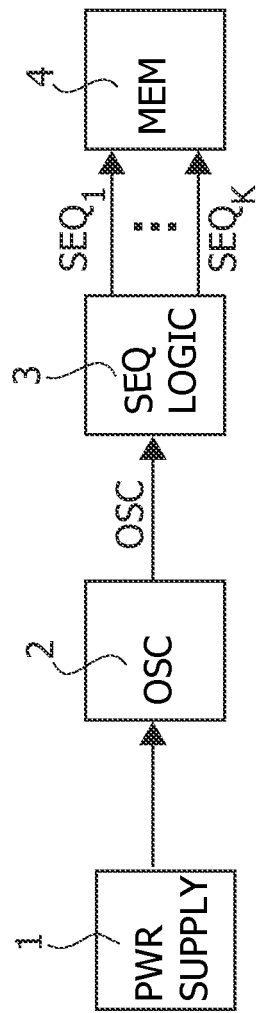
FIG. 1 shows an example of an electronic system.

In the following FIGS. 2 to 15 parts, elements or components which have already been described with reference to FIG. 1 are denoted by the same references previously used in such Figures; the description of such previously described elements will not be repeated in the following in order not to overburden the present detailed description.

As mentioned before, various embodiments of the present application relate to an electronic system configured to generate sequential logic signals.

Figure 2:
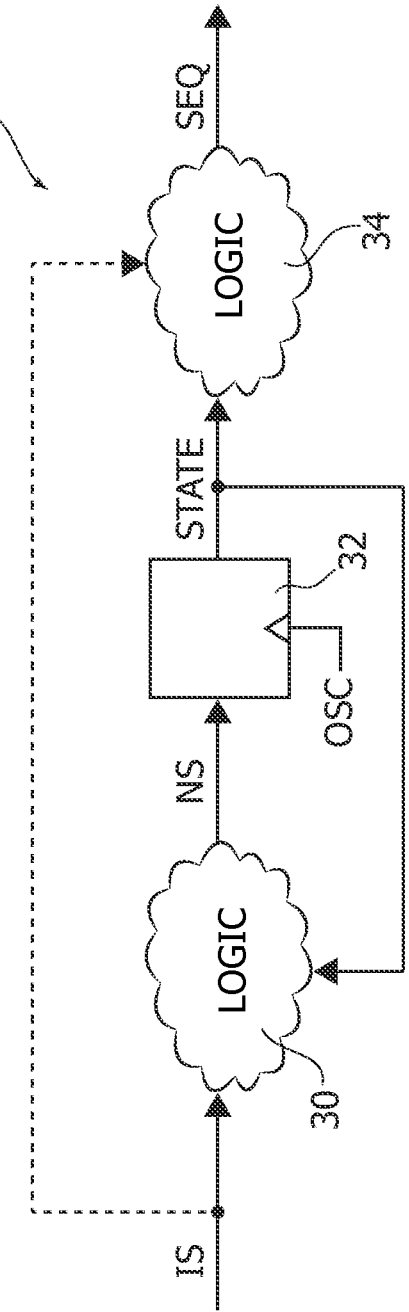
FIG. 2 shows a sequential logic circuit, in accordance with one or more embodiments.

FIG. 2 shows a comparative example of a sequential logic circuit 3 implementing a Finite State Machine (FSM).

Specifically, in the example considered, the sequential logic circuit 3 comprises a storage element 32 for storing a state signal STATE. For example, in digital circuits, the state signal STATE is usually a binary signal having a given number of bits and the state signal STATE is stored to a register 32, e.g., implemented with a corresponding number of flip-flops.

In this case, a first combinational logic circuit 30 is configured to generate a next-state signal NS as a function of the state signal STATE and one or more optional input signals IS. Generally, the input signals IS are purely optionally, because the state machine may also advance according to a predetermined and fixed sequence. For example, this is the case for a counter.

In the embodiment considered, the storage circuit 32 is thus configured to store the signal NS in response to an oscillating signal OSC, which usually corresponds to a clock signal, thereby updating the state STATE. Accordingly, the sequential logic signals SEQ may correspond to the state signal STATE, e.g., in case of a counter. However, typically, the sequential logic circuit 3 comprises a second combinational logic circuit 34 configured to generate the signals SEQ: in case of a Moore FSM, via combinational logic operations exclusively of the (bits of the) state signal STATE, or in case of a Mealy FSM, via combinational logic operations of the (bits of the) state signal STATE and one or more input signal IS.

Accordingly, compared to a mere combinational logic circuit comprising logic gates, a sequential logic circuit 3 uses a trigger signal OSC, which triggers the update of the state signal STATE and thus the advancement/transitions between the states. Generally, the update of the storage element 32 may be triggered with the rising and/or with the falling edge of the signal OSC.

As mentioned before, when the electronic system comprises a sequential logic circuit 3, the system comprises usually also a circuit 2 configured to generate the trigger signal OSC. Typically, the trigger signal OSC is a period signal with a precise timing. Accordingly, usually the signal OSC is an oscillating/clock signal provided by an oscillator circuit 2.

For example, one of the most commonly used oscillator circuit 2 is based on a ring oscillator having associated a power supply circuit 1.

Figure 3:
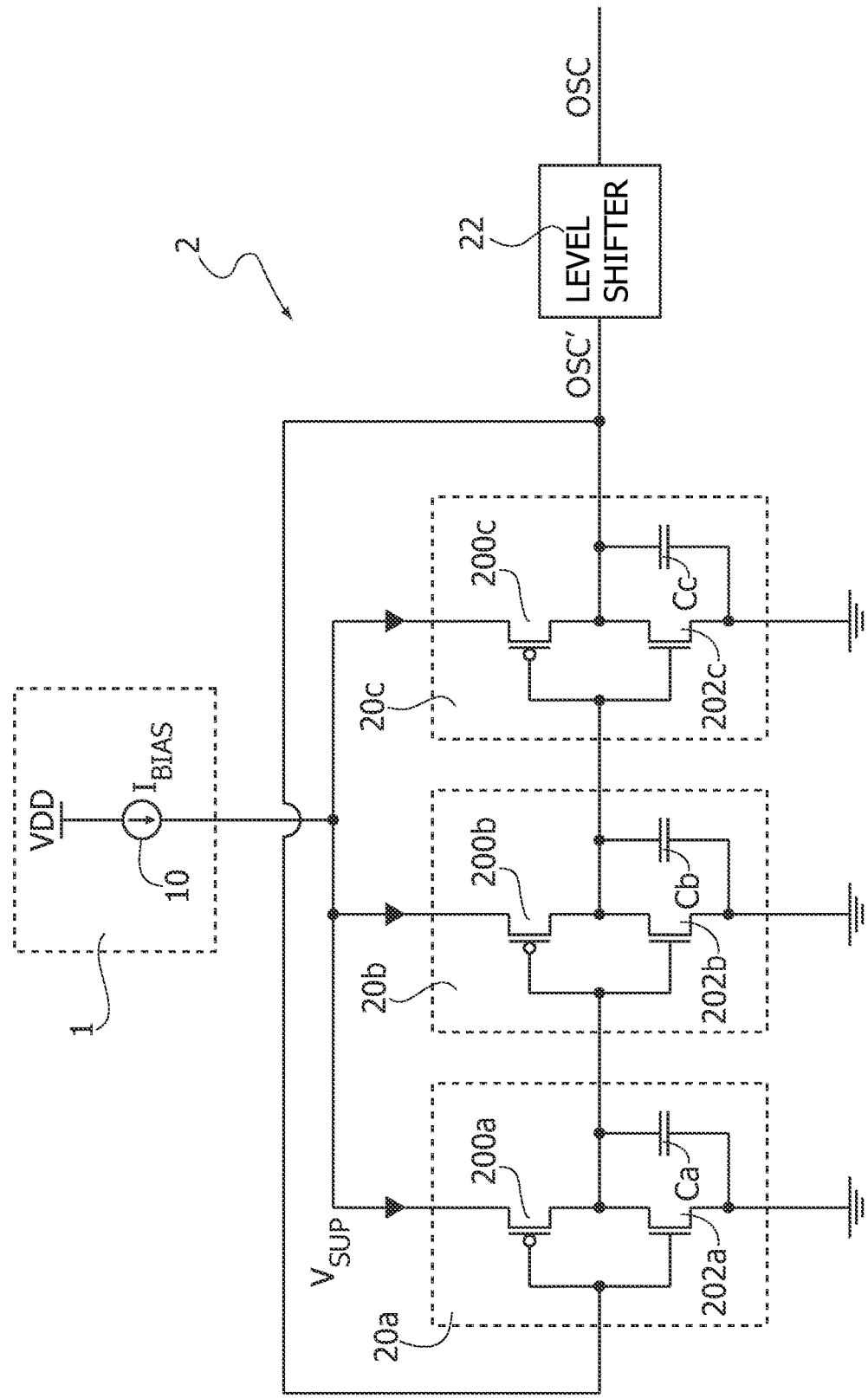
FIG. 3 shows a ring oscillator, in accordance with one or more embodiments.

FIG. 3 shows an embodiment of a ring oscillator 2. Specifically, a ring oscillator 2 comprises a plurality of n inverter stages 20. Specifically, the number n of the inverter stages 20 is odd and at least three, for example, 3, 5 or 7 inverter stages 20. Thus, the ring oscillator 2 comprises a first inverter stage 20a, a last inverter stage 20c, and one or more intermediate inverter stages 20b. Each of the inverter stages 20 comprises an input terminal and an output terminal. Moreover, the inverter stages 20 are connected in cascade in order to form a loop, i.e.: the input terminal of each intermediate inverter stage 20b is connected (e.g., directly) to the output terminal of a previous/upstream inverter stage 20 and the output terminal of each intermediate inverter stage 20b is connected (e.g., directly) to the input terminal of a following/downstream inverter stage 20; and the input terminal of the first inverter stage 20a is connected (e.g., directly) to the output terminal of the last inverter stage 20c.

For example, in the embodiment considered, each inverter stage 20 comprises a p-channel Field Effect Transistor (FET) 200, such as a p-channel Metal-Oxide-Semiconductor Field Effect Transistor (MOSFET), i.e., a PMOS, and a n-channel FET 202, such as a n-channel MOSFET, i.e., a NMOS. Accordingly, in the embodiment considered, the ring-oscillator comprises p-channel transistors 200a, 200b and 200c and n-channel transistors 202a, 202b and 202c for the inverter stages 20a, 20b and 20c, respectively.

Specifically, in the embodiment considered, the gate terminal of the p-channel transistor 200 and the gate terminal of the n-channel transistor 202 of each inverter stage 20 are connected to the input terminal of the respective inverter stage 20. The source terminal of the p-channel transistor 200 is connected via a bias current source 10 to a first reference voltage, such as a supply voltage VDD, and the source terminal of the n-channel transistor 202 is connected to a second reference voltage, wherein the second reference voltage is smaller than the first reference voltage and may be a ground. The drain terminal of the p-channel transistor 200 and the drain terminal of the n-channel transistor 202 of each inverter stage 20 are connected to the output terminal of the respective inverter stage 20. In the embodiment considered, the inverter stages 20a, 20b and 20c are thus supplied by a bias current $I_{BIAS}$ provided by the bias current source 10.

Generally, a capacitance C is associated with each output terminal, which is connected to the input terminal of a following inverter stage 20. Generally, the capacitance C may thus correspond to the parasitic drain-source capacitances of the transistors 200 and 202 of the inverter stage 20 and the parasitic gate-source capacitances of the transistors 200 and 202 of the following inverter stage 20. However, also an additional capacitance may be used, such as a capacitor connected between the drain and source terminals of each transistor 202. Thus, by alternatively charging the capacitance C via the p-channel FET 200 and discharging the capacitance C via the n-channel FET 202, the various switching stages 20 will sequentially switch, wherein the last inverter stage 20c drives again the switching of the first inverter stage 20a. The operation of such ring oscillators is well known in the art. For example, reference can be made to European Patent Application No. EP 2 482 453 A1 and United State Patent Application No. US 2009/0302954 A1, which are incorporated herein by reference.

In general, the oscillating signal OSC may thus correspond to the oscillating signal OSC' provided via the output terminal of the last inverter stage 20c or, as described in document EP 2 482 453 A1, the oscillating signal OSC may be provided via a level shifter 22 receiving the signal OSC', such as one or more further inverter stages, e.g., each comprising a p-channel FET 200 and an n-channel FET 202 connected (e.g., directly) between the first reference voltage (e.g., VDD) and the second reference voltage (e.g., ground).

Due to the fact that the switching frequency of the ring oscillator 2 depends on the charge time of the capacitances C and thus the value of the bias current $I_{BIAS}$, the frequency of the oscillating signal OSC may thus be set via the bias current $I_{BIAS}$.

As well-known in the art, the ring oscillator 2 may also be implemented with other inverter stages, or more generally, other types of delay stages 20, which are configured to propagate a pulse through the cascaded structure of delay stages 20.

Figure 4:
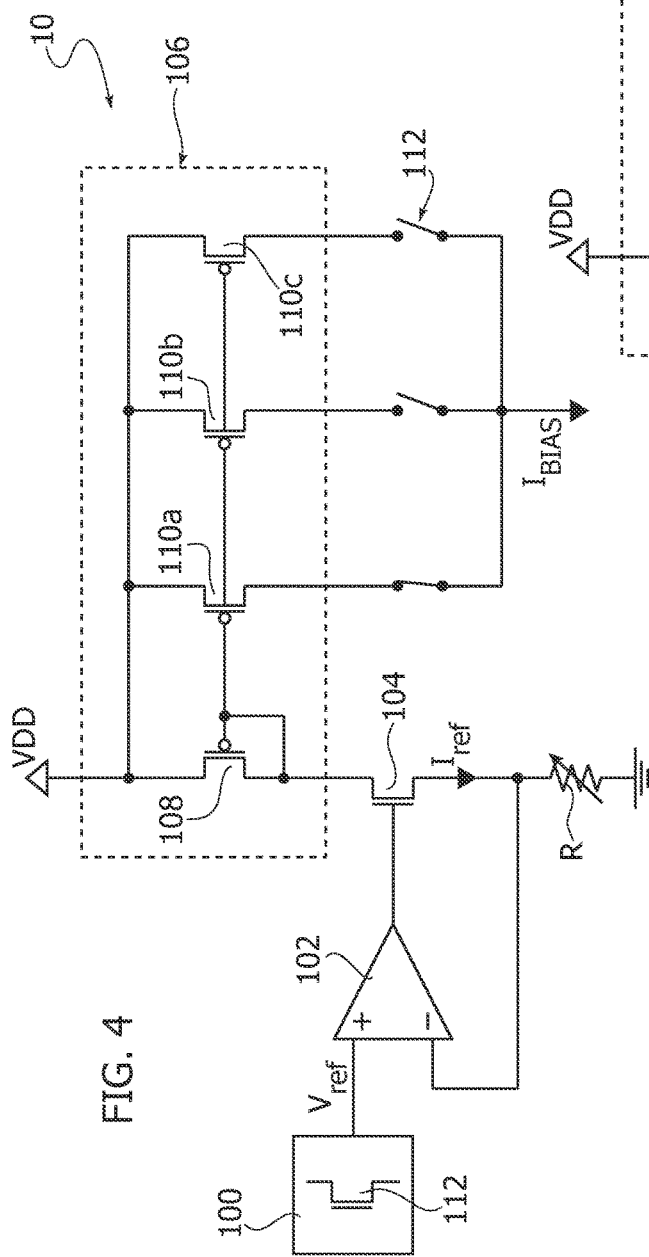
FIGS. 4 and 5 show bias current sources for the ring oscillator of FIG. 3, in accordance with one or more embodiments.
Figure 5:
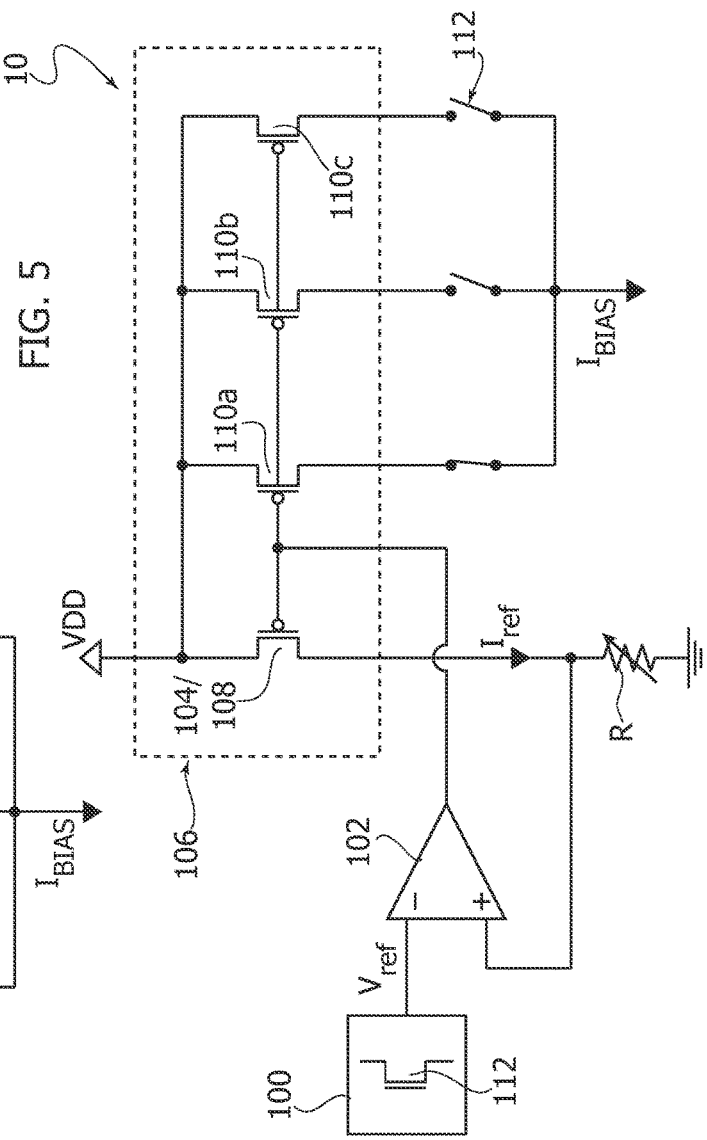

FIGS. 4 and 5 show two possible embodiments of the bias current sources 10, as described e.g., in United States Patent Application No. US 2019/0222203 A1.

Specifically, in the embodiments considered, the reference current source 10 comprises a reference voltage source 100, such as a band-gap reference voltage source; an operational amplifier 102; a variable current generator 104; and a resistor R.

Specifically, the variable current generator 104 is configured to generate a current $i_{ref}$ as a function of the signal provided at the output of the operational amplifier 102. For example, the variable current generator 104 is implemented with a n-channel FET, such as a NMOS, in FIG. 4 and the variable current generator 104 is implemented with a p-channel FET, such as a PMOS, in FIG. 5. The output of the variable current generator 104 is connected (e.g., directly) via the resistor R to a reference voltage, such as ground.

In the embodiment considered, the reference voltage source 100 generates a reference voltage $V_{ref}$, which is applied (e.g., directly) to a first input terminal of the operational amplifier 102. Conversely, the second input terminal of the operational amplifier 102 is connected (e.g., directly) to the output terminal of the current generator 104 and receives thus the voltage at the resistor R. For example, as shown in FIG. 4, when using a n-channel FET 104, the reference voltage $V_{ref}$ may be applied to the non-inverting/positive input terminal of the operational amplifier 102 and the output terminal of the current generator 104 may be connected to the inverting/negative input terminal of the operational amplifier 102. Conversely, as shown in FIG. 5, when using a p-channel FET 104, the reference voltage $V_{ref}$ may be applied to the inverting/negative input terminal of the operational amplifier 102 and the output terminal of the current generator 104 may be connected to the non-inverting/positive input terminal of the operational amplifier 102.

Accordingly, the operational amplifier 102 applies (via the feedback loop comprising the variable current generator 104 and the resistor R) the reference voltage $V_{ref}$ to the resistor R. Accordingly, in the stationary condition the current $i_{ref}$ generated by the current generator 104 will be:

$$i_{ref}=V_{ref}/R \quad (1)$$

In the embodiment considered, the reference current source 10 may thus also comprise a current mirror 106 in order to generate the bias current $I_{BIAS}$ for the inverter stages 20 based on the current $i_{ref}$.

For example, in the embodiment considered, the current mirror 106 is implemented with p-channel FETs, such as PMOS. Specifically, the current mirror 106 comprises an input p-channel FET 108, and at least one output p-channel FET 110, e.g., such as three transistors 110a, 110b and 110c, wherein the gate terminals of the output transistors 110 are driven with the same gate-source voltage as the input transistor 108, i.e., the gate terminals of the output transistors 110 are connected (e.g., directly) to the gate terminal of the input transistor 108. The source terminals of the input and output p-channel FET 108 and 110 are connected to the first reference voltage, e.g., the supply voltage VDD. The drain terminal of each of the output p-channel FETs 110 provides a respective reference current.

As shown in FIG. 4, when using a n-channel FET 104, the drain terminal and the gate terminal of the input p-channel FET 108 may be connected (e.g., directly) to the drain terminal of the n-channel FET 104, whereby the current $i_{ref}$ flows also through the input transistor FET 108.

Conversely, as shown in FIG. 5, when using a p-channel FET 104, the input p-channel FET 108 may directly correspond to the variable current source 104, i.e., the drain terminal of the input p-channel FET 108 represents the output terminal of the variable current generator 104 (connected to the resistor R) and the gate terminal of the input p-channel FET 108 is connected to the output of the operational amplifier 102. Also in this case, the current $i_{ref}$ flowing through the resistor R flows also through the input transistor FET 108. Generally, also in this case, the input p-channel FET 108 of the current mirror 106 may also be in addition to the p-channel FET 104 (similar to what has been shown in in FIG. 4).

Accordingly, when using a current mirror with a single output transistor 110, the bias current $I_{BIAS}$ may correspond to the current provided by this output transistor 110. Conversely, when using a plurality of output transistor 110 the bias current $I_{BIAS}$ may correspond to the sum of currents provided by the output transistors 110.

As mentioned before, often the (requested) bias current $I_{BIAS}$ may be settable. For example, in various embodiments, the resistance R may be a variable resistance R, e.g., implemented with plurality of resistances connected in series and/or in parallel, wherein the resistances may be selectively enabled (or disabled). Additionally or alternatively, the bias current $I_{BIAS}$ may be varied by using a current mirror 106 with a variable mirroring ratio, as schematically shown via a switching circuit 112 configured to selectively enable (or disable) the current provided by one or more of the output transistor 110. In this respect, the mirroring ratio of the various output transistors 110 with respect to the input transistor 108 may also be different.

Concerning the operation of such a ring oscillator 2, the inventors have observed that also the oscillator 2 comprises storage elements, which are implemented via the capacitances C of the inverter stages 20, or similar delay stages. Accordingly, the inventors have observed that the logic levels of the signals at one or more of the output terminals of the inverter stages 20 may also be used as a state signal STATE1.

Figure 6:
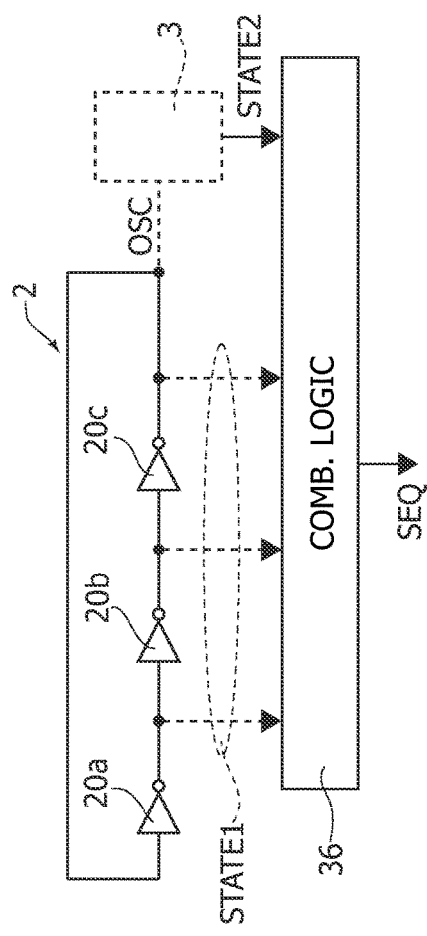
FIG. 6 shows a ring oscillator that is used to generate sequential logic signals, in accordance with one or more embodiments.

This is also shown in greater detail in FIG. 6. Specifically, in the embodiment considered, a combinational logic circuit 36 may be configured to generate one or more sequential logic signals SEQ by combining one or more of the signals at the output terminals of the inverter stages 20, i.e., the bits of the state signal STATE1.

In general, in line with the description of FIGS. 1 and 2, an additional state machine 3 may also be driven based on the oscillating signal OSC generated by the ring oscillator 2, wherein this state machine 3, in particular the storage element 32, provides a further state signal STATE2 (signal STATE in FIG. 2). Accordingly, in this case, the combinational logic circuit 36 may also implement the function of the combinational logic circuit 34. For example, such a solution is disclosed in document US 2019/0372579 A1 in the context of a high-resolution time-to-digital converter.

Concerning the operation of the circuit shown in FIG. 6, the inventors have observed that the timing of such a sequential logic circuit using a ring oscillator may not be always precise. Specifically, while the ring oscillator has a rather stable frequency, which is settable via the current $I_{BIAS}$, the timing is not precise when the oscillator is switched on and off in order to control the propagation of the pulses between the inverter stages 20, and thus also the generation of the state signal STATE2.

In fact, as described in the foregoing, the current source 10 is often implemented with one or more transistor 110 (e.g., of a current mirror 106 or driven via an operational amplifier 102) configured as a current source, wherein a first terminal of the transistor 110 is connected to a supply voltage, e.g., VDD, and the second terminal supplies the inverter stages 20.

However, this implies that when the oscillator is stopped, the current source 10 will increase the voltage at the second terminal of the current source 10 connected to the inverter stages 20, indicated in FIG. 3 as voltage $V_{SUP}$, to a voltage which may approximately reach the supply voltage at the first terminal, and the bias current $I_{BIAS}$ will be reduced approximately to zero. However, this also implies that at the next enablement of the ring oscillator 2, the charge time of the capacitances and thus the delay introduced by the inverter stages does not correspond to the expected value, which does not permit to generate immediately precise sequential signals once the ring oscillator is enabled.

In this respect, the inventors have observed that this problem may be solved by supplying the inverter stages with a regulated voltage $V_{SUP}$, and not via the bias current $I_{BIAS}$. Specifically, in order to calibrate the frequency of the ring oscillator, the voltage $V_{SUP}$ should be set to the value of the voltage at the inverter stages 20 when the oscillator is running with the expected frequency. However, in many applications it may be rather complicate to precisely regulate the voltage $V_{SUP}$ in order to obtain the requested switching frequency of the ring oscillator.

Figure 7:
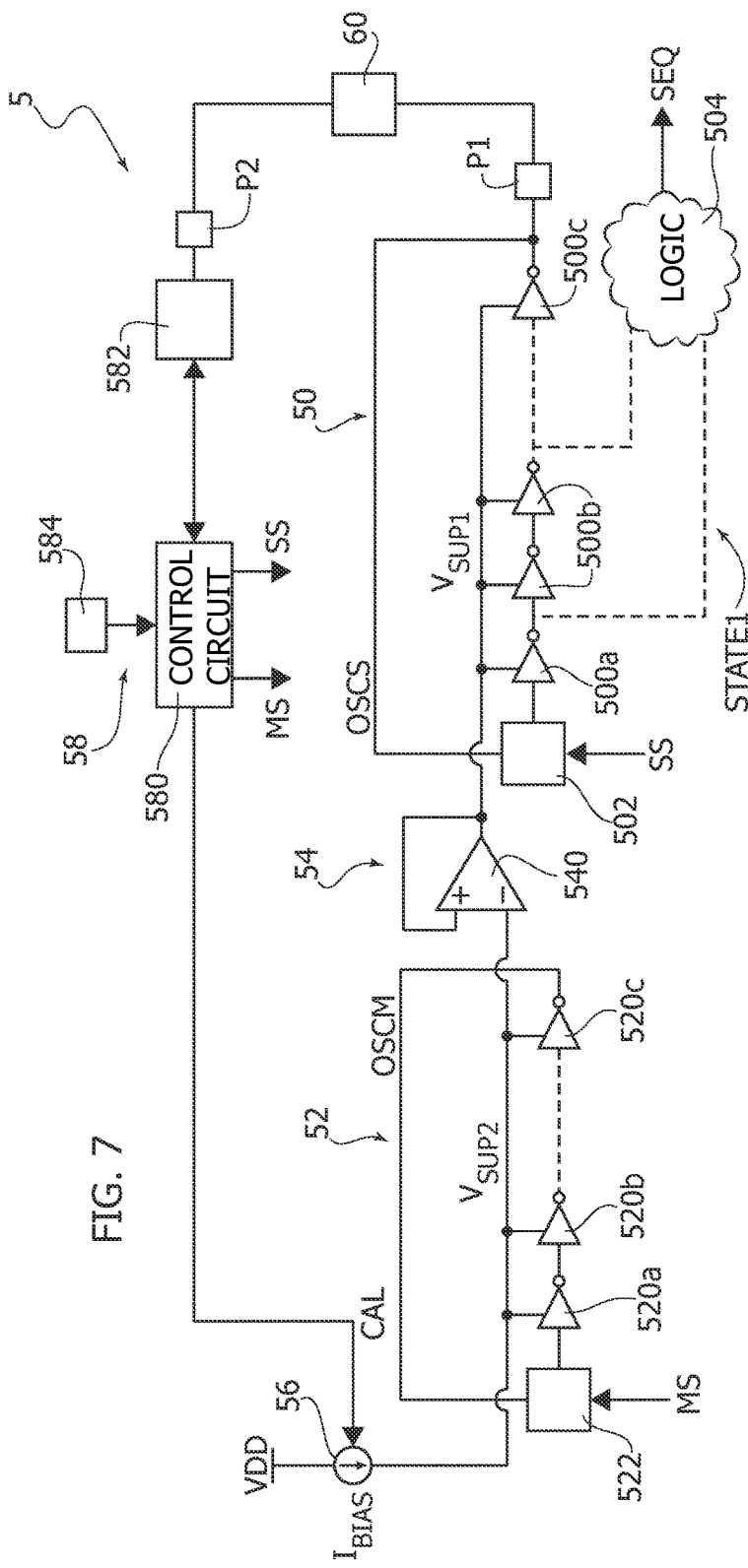
FIG. 7 shows an electronic system configured to generate sequential logic signals, in accordance with one or more embodiments.

Accordingly FIG. 7 shows a different embodiment for solving the above problem.

Specifically, FIG. 7 shows an embodiment of an electronic system configured to generate one or more sequential logic signals SEQ. For example, as described with respect to FIG. 1, such sequential logic signals may be used to drive analog and/or digital circuits 4.

Specifically, in the embodiment considered, the system comprises a ring oscillator 50. For a general description of such a ring oscillator may be made reference to the description of FIG. 3. Accordingly, also the ring oscillator 50 comprises a number n of inverter stages 500, including a first inverter stage 500a, a last inverter stage 500c and one or more intermediate inverter stages 500b, wherein the inverter stages 500 are connected in cascade in order to form a loop, i.e.: the input terminal of each intermediate inverter stage 500b is connected (e.g., directly) to the output terminal of a previous/upstream inverter stage 500 and the output terminal of each intermediate inverter stage 500b is connected (e.g., directly) to the input terminal of a following/downstream inverter stage 500; and the input terminal of the first inverter stage 500a is connected (e.g., directly) to the output terminal of the last inverter stage 500c.

In various embodiments, the ring oscillator 50 comprises also an enable circuit 502 configured to selectively enable and disable the oscillator 50 in response to one or more signals SS. For example, the enable circuit 502 may be implemented with a combinational logic circuit configured to: when the signal SS has a first logic level, e.g., is set to low, connect the input terminal of the first inverter stage 500a to a given logic level, such as high (e.g., VDD) or low (e.g., ground); and when the signal SS has a second logic level, e.g., is set to high, connect the input terminal of the first inverter stage 500a to the output terminal of the last inverter stage 500c.

For example, the enable circuit 502 may be implemented with a multiplexer. Alternatively, the enable circuit 24 may be implemented with a logic gate, such as an AND gate (the oscillator 50 is enabled when the signal SS is set to high) or an OR gate (the oscillator 50 is enabled when the signal SS is set to low) configured to drive the input terminal of the first inverter stage 500a by combining the signal received by the output terminal of the last inverter stage 500c with the enable signal SS. Generally, also more complex sequential logic circuits may be used for the circuit 502, e.g., in case the signal SS is not an enable signal but a start/stop signal comprising a trigger indicating when to start (e.g., in response to a first trigger) or stop (e.g., in response to a following second trigger) the oscillator 50, or comprises dedicated start and a dedicated stop signal.

As mentioned before, in various embodiments, one or more of the signals at the output terminals of the inverter stages 500 are provided as state signal STATE1 to a combinational logic circuit 504 configured to generate the one or more sequential logic signals SEQ. Generally, as shown in FIG. 6, the signal at the output of the last inverter stage 500c, indicated in the following as oscillating signal OSCS, may also be provided to a further sequential logic 3 and the combinational logic circuit 504 may be configured to generate the one or more sequential logic signals SEQ as a function of the state signal STATE1 provided by the ring oscillator 50 and the state signal STATE2 provided by the storage elements 32 of the sequential logic circuit 3.

As mentioned before, in various embodiments the inverter stages 500 of the ring oscillator are supplied via a voltage $V_{SUP1}$ and not via a bias current source. Specifically, in the embodiment considered, in order to precisely regulate the voltage $V_{SUP1}$, the electronic system 5 comprises a further ring oscillator 52.

Specifically, in the embodiment considered, the second ring oscillator 52 has essentially the same architecture as the ring oscillator 50. Accordingly, also the second ring oscillator 52 comprises n inverter stages 520, i.e., the number of inverter stages 500 of the ring oscillator 52 corresponds to the number n of inverter stages 500 of the ring oscillator 50, including a first inverter stage 520a, a last inverter stage 520c, and one or more intermediate inverter stages 520b, wherein each of the inverter stages 520 comprises an input terminal and an output terminal, and wherein the inverter stages 520 are connected in cascade in order to form a loop, i.e.: the input terminal of each intermediate inverter stage 520b is connected (e.g., directly) to the output terminal of a previous/upstream inverter stage 520 and the output terminal of each intermediate inverter stage 520b is connected (e.g., directly) to the input terminal of a following/downstream inverter stage 520; and the input terminal of the first inverter stage 520a is connected (e.g., directly) to the output terminal of the last inverter stage 520c.

In various embodiments, also the ring oscillator 52 may comprise an enable circuit 522 configured to selectively enable and disable the oscillator 52 in response to one or more signals MS. As will described in greater detail in the following, the oscillator 52 may also be always switched on, whereby the enable circuit 522 is purely optional. Reference can be made to the description of the circuit 502 for possible implementations of the enable circuit 522. For example, the enable circuit 522 may be implemented with a combinational logic circuit configured to: when the signal MS has a first logic level, e.g., is set to low, connect the input terminal of the first inverter stage 520a to a given logic level, such as high (e.g., VDD) or low (e.g., ground); and when the signal MS has a second logic level, e.g., is set to high, connect the input terminal of the first inverter stage 520a to the output terminal of the last inverter stage 520c.

Specifically, compared to the oscillator 50, in this case the inverter stages 520 of the oscillator 52 are supplied via a current source 56 configured to provide a bias current $I_{BIAS}$ to the inverter stage 520. For example, as described in the foregoing, the current source 56 may be a variable current source, which permits to set the bias current $I_{BIAS}$.

Generally, in the previous description, the positive supply terminal of each inverter stage 520, e.g., corresponding to the source terminal of a respective p-channel transistor 200, is connected via the bias current source 56 to a first reference voltage, e.g., VDD. Moreover, the negative supply terminal of each inverter stage 520, e.g., corresponding to the source terminal of a respective n-channel transistor 202, is connected (e.g., directly) to a second reference voltage (being smaller than the first reference voltage), e.g., ground. In this case, the current source 56 may thus be implemented with one or more p-channel FETs, such as the FET(s) 110 shown in FIG. 4 or 5.

However, alternatively, the positive supply terminals may be connected (e.g., directly) to the first reference voltage and the negative supply terminals may be connected via the bias current source 56 to the second reference voltage, whereby the current source 56 may be implemented with an n-channel FET.

Accordingly, in various embodiments, the current source 56 may be connected in series with the inverter stages 520 and the current source 56 may be implemented with a FET, wherein the gate terminal of the FET is driven in order to set the bias current $I_{BIAS}$. For example, as described in the foregoing, the bias current may be set by setting a resistance value of a reference resistance R and/or adjusting the mirroring ratio of a current mirror 106. For example, in FIG. 7, the current source 56 is configured to receive a calibration signal CAL, and set the current $I_{BIAS}$ based on the calibration signal CAL.

Accordingly, when the oscillator 52 is running, the bias current $I_{BIAS}$ may be used to set the frequency of the oscillating signal provided by the last inverter stage 520, indicated in the following also a signal OSCM. Moreover, when the oscillator 52 is running, a voltage $V_{SUP2}$ will be generated between the positive and the negative supply terminals of the inverter stages 520.

In this respect, the inventors have observed, that the oscillator 50 will switch with an almost identical switching frequency, when the value of voltage $V_{SUP2}$ is also used for the voltage $V_{SUP1}$, which is applied between the positive and the negative supply terminals of the inverter stages 500 of the oscillator 50. For example, in various embodiments, the electronic system 5 comprises for this purpose a voltage follower 54 configured to set the voltage $V_{SUP1}$ to the value of the voltage $V_{SUP2}$. For example, in the embodiment considered (the bias current source 56 is connected to the positive supply terminal of the inverter stages 520), the voltage follower 54 is implemented with an operational amplifier 540, wherein the positive/non-inverting terminal of the operational amplifier 540 is connected to the positive supply terminals of the inverter stages 520, i.e., the voltage $V_{SUP2}$, the output terminal of the operational amplifier 540 is connected to the positive supply terminals of the inverter stages 500, thus providing the voltage $V_{SUP1}$, and the output terminal of the operational amplifier 540 is also connected (as feedback) to the negative/inverting terminal of the operational amplifier 540.

Accordingly, in the embodiment considered, when the oscillator 52 is running, the supply voltage $V_{SUP1}$ will be set to the value required or otherwise utilized to obtain the requested switching frequency also for oscillator 50. Accordingly, once the oscillator 50 is enabled via the signal(s) SS, the inverter stages 500 immediately respect the expect timing, whereby the sequential logic signals SEQ are generated with a more precise timing.

In various embodiments, the electronic system 5 may also be configured to permit a calibration of the switching frequency of the signal OSCS, and more precisely of the delays introduced by the inverter stages 500. As mentioned before, the delay introduced by the inverter stages 500 may be set (indirectly) via the bias current source 56. Accordingly, in various embodiments, the signal CAL used by the bias current source 56 to set the bias current $I_{BIAS}$ may be settable.

For example, in various embodiments, the signal CAL may be provided via one or more terminals of the electronic system 5, such as pads of a respective integrated circuit or pins of a respective packaged integrated circuit.

Alternatively, the signal CAL may be provided via an analog and/or digital calibration circuit 58. For example, in various embodiments, the calibration circuit 58 may comprise an analog and/or digital control circuit 580 and an analog and/or digital storage element 584.

For example, in various embodiments, the storage element 584 is an analog storage element, such as a resistive element, wherein the resistance value of the resistive element is indicative of the value of the signal CAL. Accordingly, in this case, the control circuit 580 may be configured to generate the signal CAL as a function of the resistance value of the resistive element 584. Alternatively the resistive element 584 may also correspond directly to the resistance R shown in FIGS. 4 and 5. Accordingly, in this case, the bias current $I_{BIAS}$ may be set by trimming the resistance value of the resistive element 584, e.g., via a laser trimming.

Additionally or alternatively, in various embodiments, the storage element 584 is a digital storage element, preferably a non-volatile memory, such as a one-time programmable memory, e.g., implemented with fuses. Accordingly, in this case, the control circuit 580 may be configured to generate the signal CAL as a function of a digital value stored to the digital storage element 584. Accordingly, in this case, the bias current $I_{BIAS}$ may be set by programming the content of the digital storage element 584. For example, for this purpose, the calibration circuit 58 may comprise a communication interface 582, such as a serial communication, such as a Inter Integrated Circuit (PC), Serial Peripheral Interface (SPI) or Joint Test Action Group (JTAG) communication interface, and the communication interface 582 may receive via one or more terminals P2 of the electronic system, such as respective pads (such as so called test pads within the integrated circuit) or pins, data indicating the values to be stored to the digital storage element.

Additionally or alternatively the digital storage element 584 may also directly correspond to the switching circuit 112 shown in FIGS. 4 and 5. For example, in this case, the bias current $I_{BIAS}$ may be set by disabling one of more of the connections of the transistors 110 to the to the terminal providing the bias current $I_{BIAS}$, e.g., via laser cutting operations, thereby selectively disabling one or more of the output transistors 110.

Accordingly, in various embodiments, the electronic system 5 may be configured to provide the oscillating signal OSCS at the output of the inverter stage 500c, e.g., directly or via an additional level shifter (see also FIG. 3), to a terminal P1 of the electronic system 5, such as a respective pad (e.g., a test pad) or pin, and an external calibration circuit 60 may measure the frequency of the oscillating signal OSCS and calibrate the bias current $I_{BIAS}$, e.g., by trimming and/or programming the storage element 584.

Figure 8:
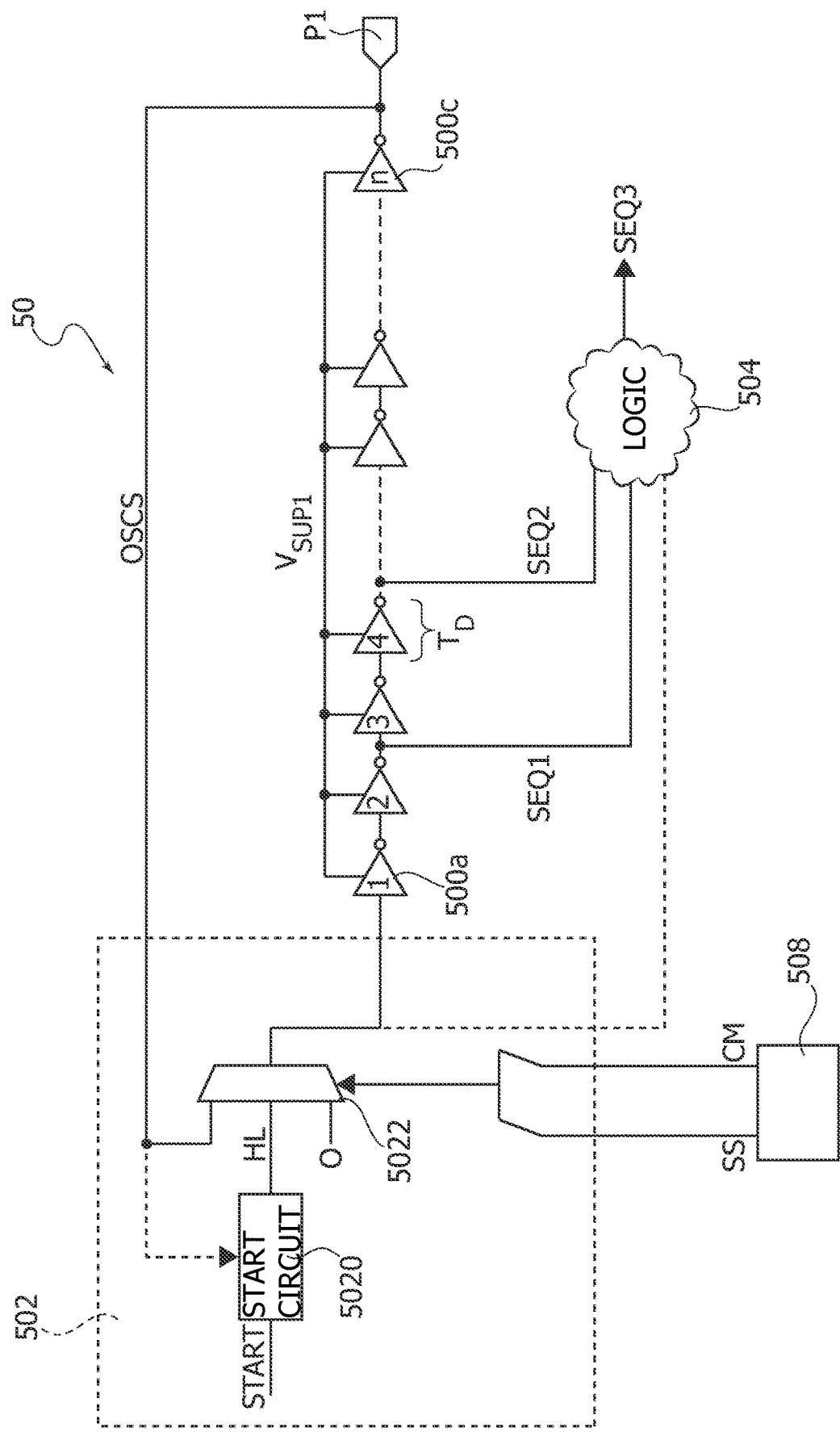
FIG. 8 shows a start circuit for the electronic system of FIG. 7, in accordance with one or more embodiments.

FIG. 8 shows in this respect an embodiment of the oscillator 50, and in particular the enable/start circuit 502.

Specifically, in the embodiment considered, the start circuit 502 comprises a multiplexer 5022 configured to: in response to determining that the signal SS has a first logic level, connect the input terminal of the first inverter stage 500a to a predetermined logic level, such as low, whereby the ring oscillator 50 is stopped; and in response to determining that the signal SS has a second logic level, connect the input terminal of the first inverter stage 500a to the output of the last inverter stage 500c, whereby the oscillator 50 oscillates.

Specifically, as will be described in greater detail in the following, in various embodiments, the multiplexer 5022 also receives a calibration mode signal CM, and the above operation applies only when the calibration mode signal CM is asserted, e.g., is set to high. Conversely, in response to determining that the calibration mode signal CM is de-asserted, the multiplexer 5022 is configured to connect the input terminal of the first inverter stage 500a to a further signal HL provided by a start circuit 5020, which sets the logic level of the signal HL as a function of a start signal START. For example, the signals SS and CM may be provided by the control circuit 580 and the start signal START may be provided by a further circuit, which requests the generation of the sequential logic signals SEQ. Generally, when using the calibration mode signal CM, the signal SS may also be omitted and the multiplexer may be configured to connect the input terminal of the first inverter stage 500a to the output of the last inverter stage 500c when the calibration mode signal CM is asserted.

As will be described in greater detail in the following, in various embodiments, the start circuit 5020 may be configured to switch the logic level of the signal HL alternatively between high and low, whereby either a rising edge or a falling edge is applied to the input terminal of the first inverter stage 500a, and the respective edge is then propagated through the inverter stages 500. For example, in this case, the ring oscillator is not running on its own, but the inverter stages 500 are used essentially as delay lines.

Figure 9:
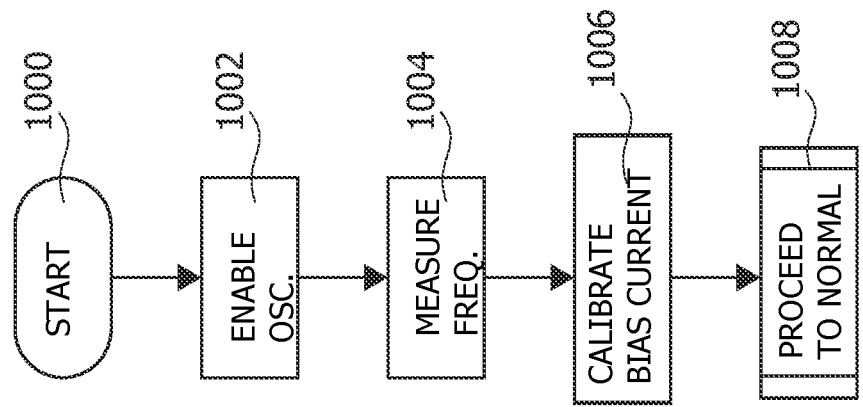

FIG. 9 shows in this respect an embodiment of the operation of the electronic system 5.

Specifically, after a start step 1000, the control circuit 580 enables (at 1002) both oscillators 50 and 52 during a calibration phase, e.g., via the signals SS and/or CM, and optionally via the signal MS if also the oscillator 52 has to be enabled and is not always switched on. For example, in various embodiments, the control circuit 580 asserts the signals MS, SS and CM. Accordingly, in this way, the electronic system 5 provides the oscillating signal OSCS via the terminal P1.

Accordingly, at a step 1004, the external calibration circuit 60 may measure the frequency of the oscillating signal OSCS and calibrate at a step 1006 the bias current $I_{BIAS}$, e.g., by trimming an analog storage element 584, programming a digital storage element 584 via the interface 582, and/or cutting the lines of a switching circuit 112.

Accordingly, once the bias current $I_{BIAS}$ has been calibrated, the oscillator 50 generates an oscillating signal OSCS having a frequency $f_{OSCS}$, i.e., the oscillating signal OSCS has a given period $T_{OSCS}=1/f_{OSCS}$, and each inverter stage 500 implements a delay circuit with a given delay $T_D=T_{OSCS}/n$. The electronic system 5 proceeds then to a normal operation phase 1008.

Figure 10:
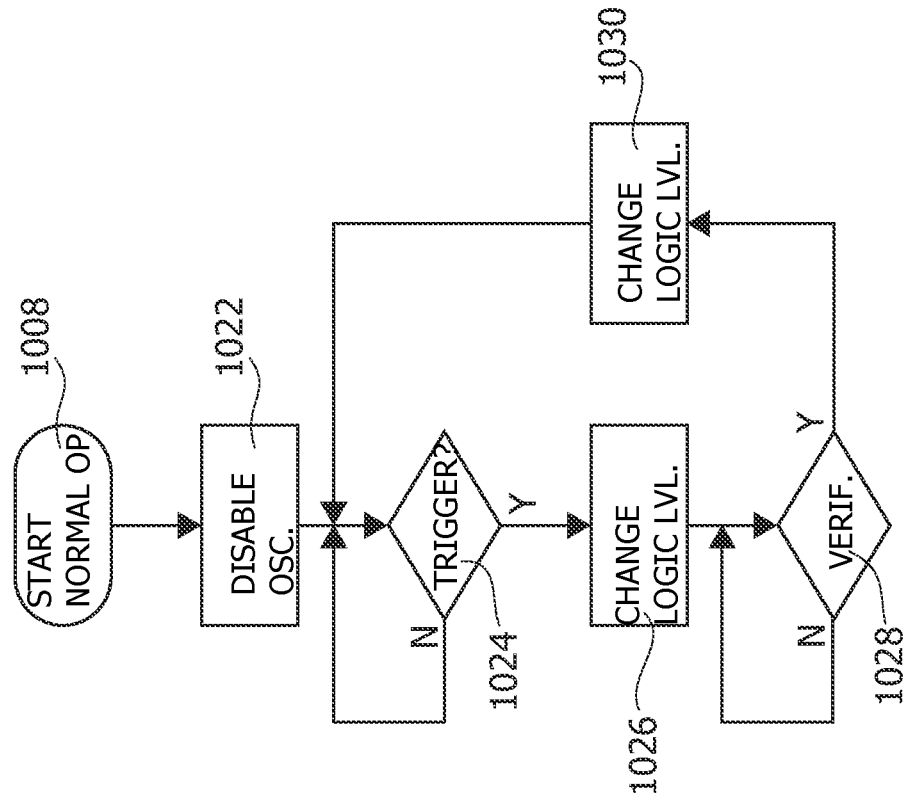
FIGS. 9 to 13 illustrate operation of the electronic system of FIG. 7, in accordance with one or more embodiments.

FIG. 10 shows a first embodiment of the normal operating phase 1008.

Specifically, in the embodiment considered, once the normal operating phase 1008 is started, the electronic system 5 disables at a step 1022 the oscillator 50. For example, with respect to the embodiment shown in FIG. 8, the oscillator 50 may be stopped by de-asserting the calibration mode signal CM and/or the start signal SS, whereby the input terminal of the first inverter stage 500a is connected to the start circuit 5020. Accordingly, once the oscillator 50 is disabled, the oscillator 50 will reach a predetermined switching state.

Next, at a step 1024, the start circuit 502, e.g., the circuit 5020, monitors the start signal START in order to detect a trigger in the start signal START. Accordingly, in case no trigger is detected (output "N" of the verification step 1024), the start circuit 502 returns to the step 1024. Conversely, in case a trigger is detected (output "Y" of the verification step 1024), the start circuit 502 proceeds to a step 1026 where the start circuit changes the logic level of the signal applied to the input terminal of the first inverter stage 520a, e.g., by setting the signal HL to high.

Figure 11:
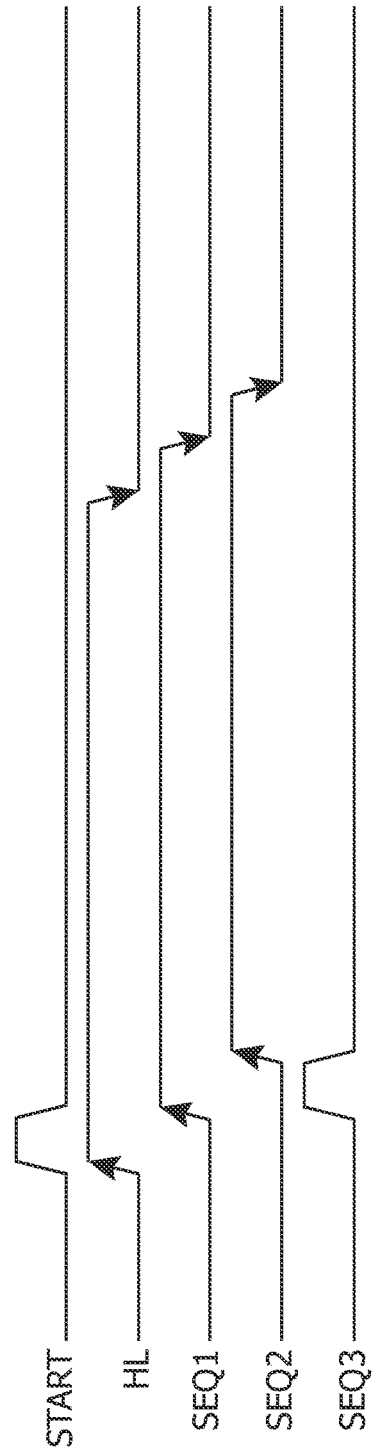

Accordingly, as shown in FIG. 11, the respective (e.g., rising) edge of the signal HL will be propagated through the inverter stages 500 with a delay $T_D$ for each inverter stage 500. For example, in FIGS. 8 and 11 are shown a signal SEQ1 corresponding to the signal at the output of the second inverter stage, which thus asserts it output after a delay of 2 $T_D$ with respect to the signal HL, and a signal SEQ2 corresponding to the signal at the output of the fourth inverter stage 500, which thus asserts it output after a delay of 4 $T_D$ with respect to the signal HL.

Moreover, in FIG. 8, the signals SEQ1 and SEQ2 are provided to a combinational logic circuit 504 configured to: in response to determining that the signal SEQ1 is asserted and the signal SEQ2 is de-asserted, assert a signal SEQ3; and in response to determining that the signal SEQ1 is de-asserted or the signal SEQ2 is asserted, de-assert a signal SEQ3.

For example, in the embodiment considered, the combinational logic circuit 504 may be implemented with a logic XOR gate.

Accordingly, in general, a signal at the output terminal of the inverter stages 500 may directly correspond to a sequential logic signal SEQ (e.g., signals SEQ1 and SEQ2), and/or a combinational logic circuit 504 may be configured to generate a sequential logic signal SEQ as a function of one or more of the signals at the output terminal of the inverter stages 500 (e.g., signal SEQ3).

In FIG. 10, the start circuit 502 proceeds then to a verification step 1028 where the start circuit 502 waits that the generation of the sequential logic signals SEQ has been completed. For example, for this purpose, the start circuit 502 may receive as feedback the output of one of the inverter stages 500. For example, in FIG. 8, the start circuit 6020 receives the signal OSCS generated by the last inverter stage 500c.

Accordingly, when the logic level of the feedback signal does not change (output "N" of the verification step 1028) the start circuit 502 continues to wait at the step 1028. Conversely, in the embodiment considered, once the logic level of the feedback signal changes, the start circuit 502 changes at a step 1030 the logic level at the input of the first inverter stage 500a, e.g., by setting the signal HL to low, whereby the logic levels at the output terminals of the inverter stages are again brought to the initial condition. Accordingly, after the step 1030, the start circuit 5020 may return to the step 1022 in order to wait for the next start trigger.

The inventors have observed that the above operation has various disadvantages. On the one hand, in response to the (e.g., falling) edge of the signal HL generated via the step 1030, the sequential logic signals SEQ1 and SEQ2 will again change. Thus, in order to avoid an incorrect generation of the combined signal generated via the circuit 504, the combination logic circuit 504 may need to take into account also the logic level of the signal HL. Moreover, due to the fact that the edge generated at the step 1030 has to be propagated through all inverter stages 500, the bandwidth of the generation of the sequential logic signals SEQ is significantly reduced.

Figure 12:
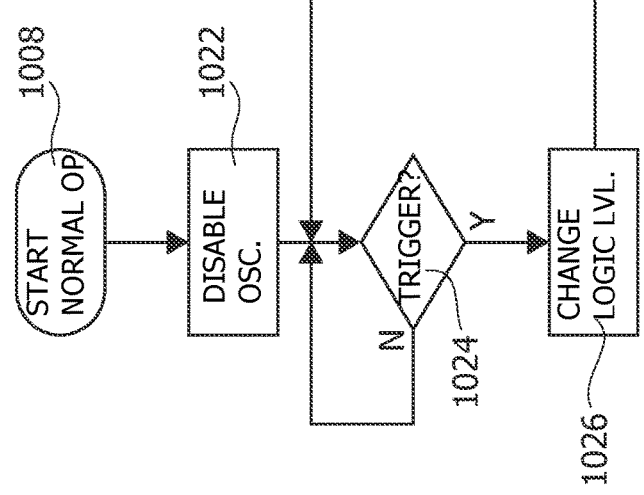

Accordingly, FIG. 12 shows a second embodiment of the normal operating phase 1008.

Specifically, in the embodiment considered, once the normal operating phase 1008 is started, the electronic system 5 disables at a step 1022 again the oscillator 50. Next, at a step 1024, the start circuit 502, e.g., the circuit 5020, monitors again the start signal START in order to detect a trigger in the start signal START. Specifically, once a trigger in the start signal START is detected (output "Y" of the verification step 1024), the start circuit 502 proceeds to a step 1026 where the start circuit changes the logic level of the signal applied to the input terminal of the first inverter stage 520a, e.g., by setting the signal HL to high.

Figure 13:
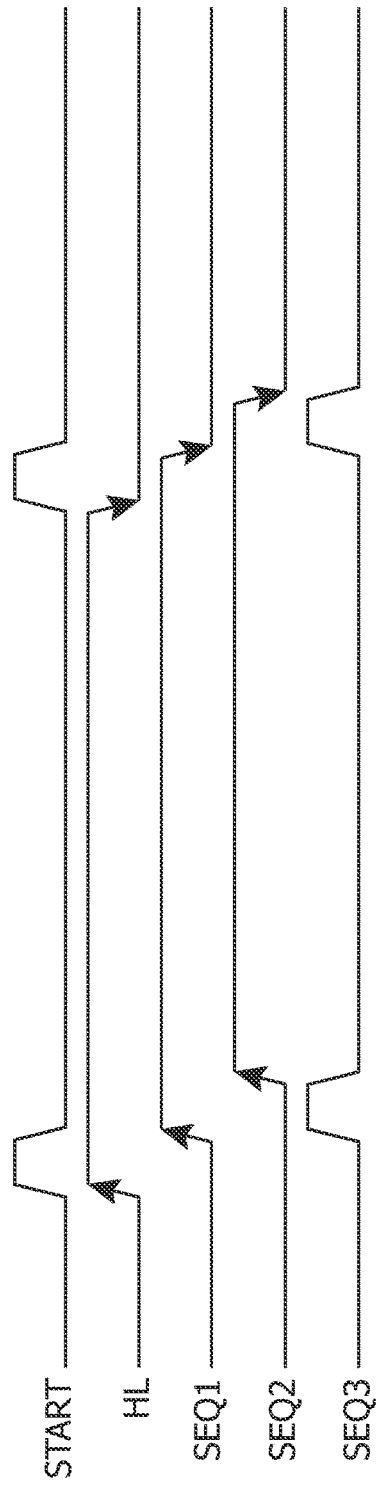

Accordingly, as shown in FIG. 13, the respective (e.g., rising) edge will be propagated through the inverter stages with a delay $T_D$ for each inverter stage 500. For example, again are shown the signals SEQ1 and SEQ2 at the output of the second and fourth inverter stages 500.

However, in this case the start circuit 502 returns immediately to the step 1024. Accordingly, once the next trigger in the start signal START is detected (output "Y" of the verification step 1024), the start circuit 502 proceeds again to the step 1026 where the start circuit changes the logic level of the signal applied to the input terminal of the first inverter stage 500a, e.g., by setting the signal HL to low.

Accordingly, as shown in FIG. 13, the respective (e.g., falling) edge will be propagated through the inverter stages with a delay $T_D$ for each inverter stage 500.

Accordingly, in this case, the combined sequential logic signal SEQ3 may be generated without taking into account the signal HL. Moreover, the bandwidth may be improved, because the oscillator has not to be reset as in the embodiment described with respect to FIGS. 10 and 11.

Accordingly, in various embodiments, the start circuit 5020 may be configured to switch the logic level of the signal HL alternatively between high and low, whereby either a rising edge or a falling edge is applied to the input terminal of the first inverter stage 500a in response to the start signal START.

Figure 14:
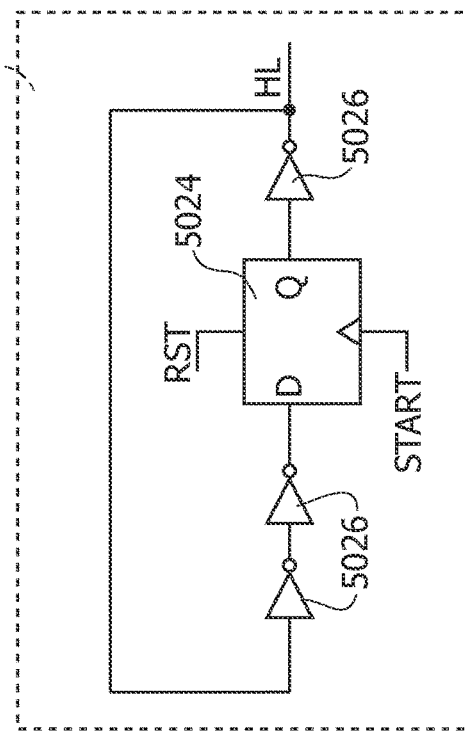
FIG. 14 shows a start circuit for the electronic system of FIG. 7 or 8, in accordance with one or more embodiments.

For example, FIG. 14 shows a possible embodiment to the start circuit 5020.

Specifically, in the embodiment considered, the start circuit 5024 comprises a flip-flop 5024, such as a D-type flip flop, configured to store an input signal D in response to a rising (or alternatively a falling) edge of the start signal START. Moreover, the output signal Q provided via the flip-flip 5024 is feed back to the input of the flip-flop 5024 via an odd number of inverters 5026, such as three inverters. Accordingly, by applying triggers via the start signal START, the output of the flip-flop 5024 will alternatively switch between high and low. Accordingly, the signal HL may be generated as a function of the output signal Q of the flip-flop 5024. Specifically, the signal HL may correspond to the signal Q or may correspond to an inverted version of the signal Q.

Figure 15:
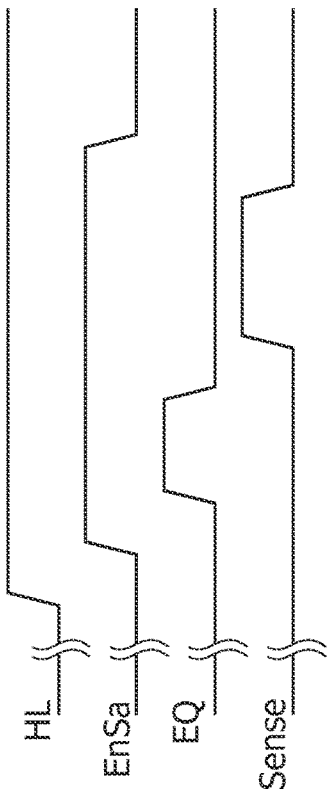
FIG. 15 shows sequential signals generated by the electronic system of FIG. 7, in accordance with one or more embodiments.

FIG. 15 shows a possible application of the previous described solutions in order to generate typical signals of a non-volatile memory.

For example, in FIG. 15, once the signal START is asserted, the start circuit 5020 asserts the signal HL, whereby a rising edge is applied to the input of the first inverter stage 500a. As description in the foregoing, this edge is then propagated through the inverter stages 500, wherein each inverter stages changes the logic level of the respective output terminal after the delay $T_D$.

For example, in FIG. 15, the inverter stages 500 and the combinational logic circuit 504 are configured to generate the following signals: a sense-amplifier enable-signal EnSa; a equalisation signal used to start the equalization of the sense-amplifier; and a sense signal Sense used to indicate that the sense amplifier should read a given value and apply to data to a given data line of the memory.

In the embodiment considered, the signals are generated with respective time slots, wherein each time slot correspond to the delay $T_D$ or a multiple thereof. For example, in FIG. 15, each time slot as a duration of 2 $T_D$.

For example, in this case, the signal EnSa is asserted when the signal at the output of the second inverter stage is asserted. Next, the signal EQ is asserted when the signal at the output of the fourth inverter stage is asserted, and again de-asserted when the signal at the output of the eighth inverter stage is asserted. Next, the signal Sense is asserted when the signal at the output of the tenth inverter stage is asserted, and again de-asserted when the signal at the output of the sixteenth inverter stage is asserted. Finally, the signal EnSa is de-asserted when the signal at the output of the eighteenth inverter stage is asserted. For example, by indicating the output signals of the n inverter stages as signals $SEQ_1$-$SEQ_n$, the combinational logic circuit 504 may implement the following logic operations:

$EnSa=SEQ_2$ XOR $SEQ_{18}$
$EQ=SEQ_4$ XOR $SEQ_8$
$Sense=SEQ_{10}$ XOR $SEQ_{16}$ Of course, without prejudice to the principles of the present disclosure, the details of construction and the embodiments may vary widely with respect to what has been described and illustrated herein purely by way of example, without thereby departing from the scope of the present disclosure.

What is claimed is:

1. An electronic system, comprising:
    a first ring oscillator comprising a first plurality of cascaded inverter stages including a first inverter stage, a last inverter stage, and one or more intermediate inverter stages, each of the inverter stages of the first plurality of cascaded inverter stages including an input terminal and an output terminal;
    a combinational logic circuit configured to generate a sequential logic signal by combining signals at the output terminals of at least two of the inverter stages of the first ring oscillator;
    a second ring oscillator comprising a second plurality of cascaded inverter stages including a first inverter stage, a last inverter stage, and one or more intermediate inverter stages;
    a bias current source configured to supply the second plurality of cascaded inverter stages of the second ring oscillator with a bias current, wherein a first voltage is generated at the second plurality of cascaded inverter stages of the second ring oscillator; and
    a voltage follower configured to supply the first plurality of cascaded inverter stages of the first ring oscillator with a second voltage corresponding to the first voltage generated at the second plurality of cascaded inverter stages of the second ring oscillator.

2. The electronic system of claim 1, wherein a number of inverter stages of the second plurality of cascaded inverter stages of the second ring oscillator is the same as a number of inverter stages of the first plurality of cascaded inverter stages of the first ring oscillator.

3. The electronic system of claim 1, wherein the first ring oscillator comprises a start circuit configured to:
    receive a calibration mode signal;
    determine whether the calibration mode signal indicates a calibration mode or a normal mode;
    in response to determining that the calibration mode signal indicates the calibration mode, cause the first ring oscillator to oscillate by connecting the output terminal of the last inverter stage of the first ring oscillator to the input terminal of the first inverter stage of the first ring oscillator; and
    in response to determining that the calibration mode signal indicates the normal operating mode, selectively change, in response to a start signal, a logic level of a signal applied to the input terminal of the first inverter stage of the first ring oscillator, wherein a rising or falling edge of the signal applied to the input terminal of the first inverter stage is propagated through the first plurality of cascaded inverter stages of the first ring oscillator.

4. The electronic system of claim 3, wherein the bias current source is configured to generate a variable current based on a calibration signal.

5. The electronic system of claim 4, comprising:
    a storage element configured to store a value indicative of the calibration signal; and
    a control circuit configured to generate the calibration signal based on the value stored by the storage element.

6. The electronic system of claim 5, comprising a communication interface, wherein the control circuit is configured to:

receive, during the calibration mode, data via the communication interface; and update the calibration signal by storing the data to the storage element.

7. The electronic system of claim 5, further comprising a calibration circuit configured to:

measure, during the calibration mode, a frequency of a signal output by one of the inverter stages of the first ring oscillator; and adjust the frequency by programming the storage element.

8. The electronic system of claim 1, wherein the bias current source comprises one or more Field Effect Transistors (FETs), wherein the bias current is set by driving gate terminals of the one or more FETs.

9. The electronic system of claim 1, wherein each inverter stage of the first plurality of cascaded inverter stages and the second plurality of cascaded inverter stages comprises a positive supply terminal and a negative supply terminal, a p-channel Field Effect Transistor (FET) and an n-channel FET, wherein a source terminal of the p-channel FET is connected to the positive supply terminal, a source terminal of the n-channel FET is connected to the negative supply terminal, the input terminal of the inverter stage is connected to gate terminals of the p-channel FET and the n-channel FET, and the output terminal of the inverter stage is connected to drain terminals of the p-channel FET and the n-channel FET.

10. An integrated circuit comprising:

a first ring oscillator and a second ring oscillator, each of the first and second ring oscillators including inverter stages, each of the inverter stages including an input terminal, an output terminal, a first inverter stage, a last inverter stage, and at least one intermediate inverter stage coupled between the first inverter stage and the last inverter stage;

a combinational logic circuit configured to generate a sequential logic signal based on output signals at the output terminals of at least two of the inverter stages of the first ring oscillator;

a bias current source configured to supply a bias current to the inverter stages of the second ring oscillator, wherein a first voltage is generated at the inverter stages of the second ring oscillator; and a voltage follower configured to supply a second voltage to the inverter stages of the first ring oscillator, the second voltage having a voltage level corresponding to a voltage level of the first voltage.

11. The integrated circuit of claim 10, wherein a number of inverter stages of the second ring oscillator is the same as a number of inverter stages of the first ring oscillator.

12. The integrated circuit of claim 10, wherein the first ring oscillator comprises a start circuit configured to:

receive a calibration mode signal;

determine whether the calibration mode signal indicates a calibration mode or a normal mode;

in response to determining that the calibration mode signal indicates the calibration mode, cause the first ring oscillator to oscillate by connecting the output terminal of the last inverter stage of the first ring oscillator to the input terminal of the first inverter stage of the first ring oscillator; and in response to determining that the calibration mode signal indicates the normal operating mode, selectively change, in response to a start signal, a logic level of a signal applied to the input terminal of the first inverter stage of the first ring oscillator, wherein a rising or falling edge of the signal applied to the input terminal of the first inverter stage is propagated through the inverter stages of the first ring oscillator.

13. The integrated circuit of claim 12, wherein the bias current source is configured to generate a variable current based on a calibration signal.

14. The integrated circuit of claim 13, further comprising:

a storage element configured to store a value indicative of the calibration signal; and a control circuit configured to generate the calibration signal based on the value stored by the storage element.

15. The integrated circuit of claim 14, further comprising a communication interface, wherein the control circuit is configured to:

receive, during the calibration mode, data via the communication interface; and update the calibration signal by storing the data to the storage element.

16. The integrated circuit of claim 12, further comprising a calibration circuit configured to:

measure, during the calibration mode, a frequency of a signal output by one of the inverter stages of the first ring oscillator; and adjust the frequency by programming a storage element configured to store a value for controlling the bias current source.

17. The integrated circuit of claim 10, wherein the bias current source comprises one or more Field Effect Transistors (FETs), wherein the bias current is set by driving gate terminals of the one or more FETs.

18. The integrated circuit of claim 10, wherein each inverter stage of the first and second ring oscillators includes a positive supply terminal, a negative supply terminal, a p-channel Field Effect Transistor (FET), and an n-channel FET, wherein a source terminal of the p-channel FET is connected to the positive supply terminal, a source terminal of the n-channel FET is connected to the negative supply terminal, the input terminal of the inverter stage is connected to gate terminals of the p-channel FET and the n-channel FET, and the output terminal of the inverter stage is connected to drain terminals of the p-channel FET and the n-channel FET.

19. A method of operating an electronic system, the electronic system including a first ring oscillator and a second ring oscillator, each of the first and second ring oscillators including inverter stages, each of the inverter stages including an input terminal, an output terminal, a first inverter stage, a last inverter stage, and at least one intermediate inverter stage coupled between the first inverter stage and the last inverter stage, the method comprising:

generating a first voltage at the inverter stages of the second ring oscillator by supplying, by a bias current source, a bias current to the second ring oscillator; and generating, by a voltage follower, a second voltage corresponding to the first voltage, and applying the second voltage to the inverter stages of the first ring oscillator.

20. The method of claim 19, comprising:

generating, by a combinational logic circuit, a sequential logic signal by combining signals at the output terminals of at least two of the inverter stages of the first ring oscillator.

* * * * *